United States Patent
Tseng et al.

(10) Patent No.: US 11,251,579 B2
(45) Date of Patent: Feb. 15, 2022

(54) LASER COLLIMATING MODULE

(71) Applicant: ARIMA LASERS CORP., Taoyuan (TW)

(72) Inventors: Cheng-Tsung Tseng, Taoyuan (TW); Ming-Hui Fang, Taoyuan (TW)

(73) Assignee: Arima Lasers Corp., Taoyuan (TW)

( * ) Notice: Subject to any disclaimer, the term of this patent is extended or adjusted under 35 U.S.C. 154(b) by 216 days.

(21) Appl. No.: 16/593,129

(22) Filed: Oct. 4, 2019

(65) Prior Publication Data
US 2021/0104864 A1   Apr. 8, 2021

(51) Int. Cl.
| | | |
|---|---|---|
| G02B 27/30 | (2006.01) | |
| H01S 5/02253 | (2021.01) | |
| H01S 5/02212 | (2021.01) | |
| H01S 5/024 | (2006.01) | |
| G02B 7/02 | (2021.01) | |
| G02B 27/09 | (2006.01) | |

(52) U.S. Cl.
CPC .......... *H01S 5/02253* (2021.01); *G02B 7/025* (2013.01); *G02B 27/0916* (2013.01); *G02B 27/0927* (2013.01); *G02B 27/0966* (2013.01); *G02B 27/30* (2013.01); *H01S 5/02212* (2013.01); *H01S 5/02469* (2013.01)

(58) Field of Classification Search
CPC ............................ G02B 27/09; G02B 27/0916; G02B 27/0938; G02B 27/095; G02B 27/0955; G02B 27/0966; G02B 27/0927; G02B 27/30; G02B 19/0014; G02B 19/0052; G02B 19/0047; G02B 19/0057; H01L 33/58; H01S 5/02253
See application file for complete search history.

(56) References Cited

U.S. PATENT DOCUMENTS

2016/0276802 A1* 9/2016 Gao ........................ H01S 5/068

* cited by examiner

*Primary Examiner* — Joseph P Martinez
(74) *Attorney, Agent, or Firm* — Rosenberg, Klein & Lee

(57) ABSTRACT

A laser collimating module includes a heat dissipating base having a fixing element on a top thereof and a plurality of pins at a bottom thereof, a laser diode chip disposed on the fixing element, a cap covering on the heat dissipating base with a placing space therein and an opening on a top thereof, and a cylindrical lens disposed in the placing space. The opening of the cap is connecting to the placing space and aligning with the laser diode chip correspondingly. The cylindrical lens has a first surface facing toward the laser diode chip with a first minimized distance arranged therebetween and a second surface facing toward the opening with a second minimized distance arranged therebetween. The laser diode chip is stimulated and emits an elliptical laser beam, and a light emitting angle is formed. As the elliptical laser beam passes through the cylindrical lens, the light emitting angle is narrowed and the laser beam is collimated to be a linear beam.

3 Claims, 11 Drawing Sheets

LASER COLLIMATING MODULE

BACKGROUND OF THE INVENTION

1. Field of the Invention

The invention relates to a laser module, particularly to one that collimates laser beams with a miniature volume.

2. Description of the Related Art

Referring to FIGS. 1A and 1B, a laser adjusting assembly 10 is disclosed in Taiwanese patent No. 1364148. As shown in FIG. 1A, the laser adjusting assembly 10 includes a hollow column 11, a laser diode 12 disposed at an end of the hollow column 11 therein, a focusing lens 13 disposed inside the hollow column 11 at a front of the laser diode 12 and fixed by a seat 131 and a fixing ring 132 inside the hollow column 11, an adjusting ring 14 engaging another end of the hollow column 11 and having a reference section 141, a cylindrical lens 15 engaging in a fixing element 151 and further engaging the adjusting ring 14 and fixed thereby and an external tube 16 engaging and fixing the adjusting ring 14 and the hollow column 11. The fixing element 151 includes a hollow section 1511 and a pair of fixing pieces 1512 symmetrically arranged at the corresponding sides of the fixing element 151; each of the pair of fixing pieces 1512 further has a placing hole 1513 formed on a periphery thereof for disposing the cylindrical lens 15 therein. The hollow section 1511 further has a pair of fixing trenches 1514 formed connecting a corresponding placing hole 1513 of a corresponding fixing piece 1512 to an end close to the seat 131 fixing the focusing lens 13. The external tube 16 further includes a window 161 and an opening 162.

As shown in FIG. 1B, after the focusing lens 13 is fixed disposed inside the hollow column 11, the cylindrical lens 15 is engaged in the placing holes 1513 of the pair of fixing pieces 1512 and the fixing element 151 is further engaged with the adjusting ring 14 and the external tube 16 in a position where the reference section 141 of the adjusting ring 14 is perpendicular to an axis of the cylindrical lens 15. Meanwhile, the fixing trenches 1514 are held tighter and therefore holding a fixed position of the cylindrical lens 15. Then the laser diode 12 is stimulated and emits a laser beam $L_{11}$ to the focusing lens 13 and further to the cylindrical lens 15 for collimation of the emitted laser beam $L_{11}$. Consequently, a linear beam $L_{12}$ is emitted from the laser adjusting assembly 10 and a light emitting angle $\theta_1$ greater than 120 degree is formed during the process.

In the structures and the light emitting process disclosed above, the laser adjusting assembly 10 has the focusing lens 13 for the laser beam $L_{11}$ to be emitted thereto before passing through the cylindrical lens 15. In other words, the optical path of the laser beam is formed as the secondary optics design. Also, the light emitting angle $\theta_1$ is therefore greater than 120 degree, resulting in the impossibility of narrowing the linear beam $L_{12}$ emitted from the laser adjusting assembly 10. Furthermore, the laser adjusting assembly 10 needs quite an amount of components for assembly, and a huge volume is unavoidable due to the distances required between the components within the assembly.

SUMMARY OF THE INVENTION

It is a primary objective of the present invention to provide a laser collimating module that has the primary optics design without a focusing lens. The laser collimating module therefore has less components and a miniature volume.

In order to achieve the above objective, the laser collimating module includes a heat dissipating base including a fixing element on a top thereof and a plurality of pins at a bottom thereof; a laser diode chip disposed on the fixing element; a cap covering on the heat dissipating base and including a placing space therein and an opening on a top thereof; the opening arranged above the placing space and connecting thereto, correspondingly aligning with the laser diode chip; and a cylindrical lens disposed in the placing space, having a first surface facing toward the laser diode chip with a first minimized distance arranged therebetween and a second surface facing toward the opening with a second minimized distance arranged therebetween, thereby the laser diode chip being stimulated, emitting an elliptical laser beam to the cylindrical lens and forming a light emitting angle; as the laser beam passing through the cylindrical lens, the light emitting angle being narrowed and the laser beam being collimated and becoming a linear beam emitted from the laser collimating module.

In addition, the cylindrical lens has a radius arranged between 0.5-1 mm and is arranged in a shape of either cylindrical or semi-cylindrical.

The cap includes a flat surface on a lateral side thereof connecting to the placing space, forming a circular opening to be filled in with an adhesives for fixing a position of the cylindrical lens.

With structures disclosed above, the present invention has the laser diode chip, the cylindrical lens and the opening arranged and fixed with a close distance between each two of them to be assembled with comparatively less components. The volume of the laser collimating module is also reduced to a miniature scale.

DETAILED DESCRIPTION OF THE PREFERRED EMBODIMENT

Figure 1A:
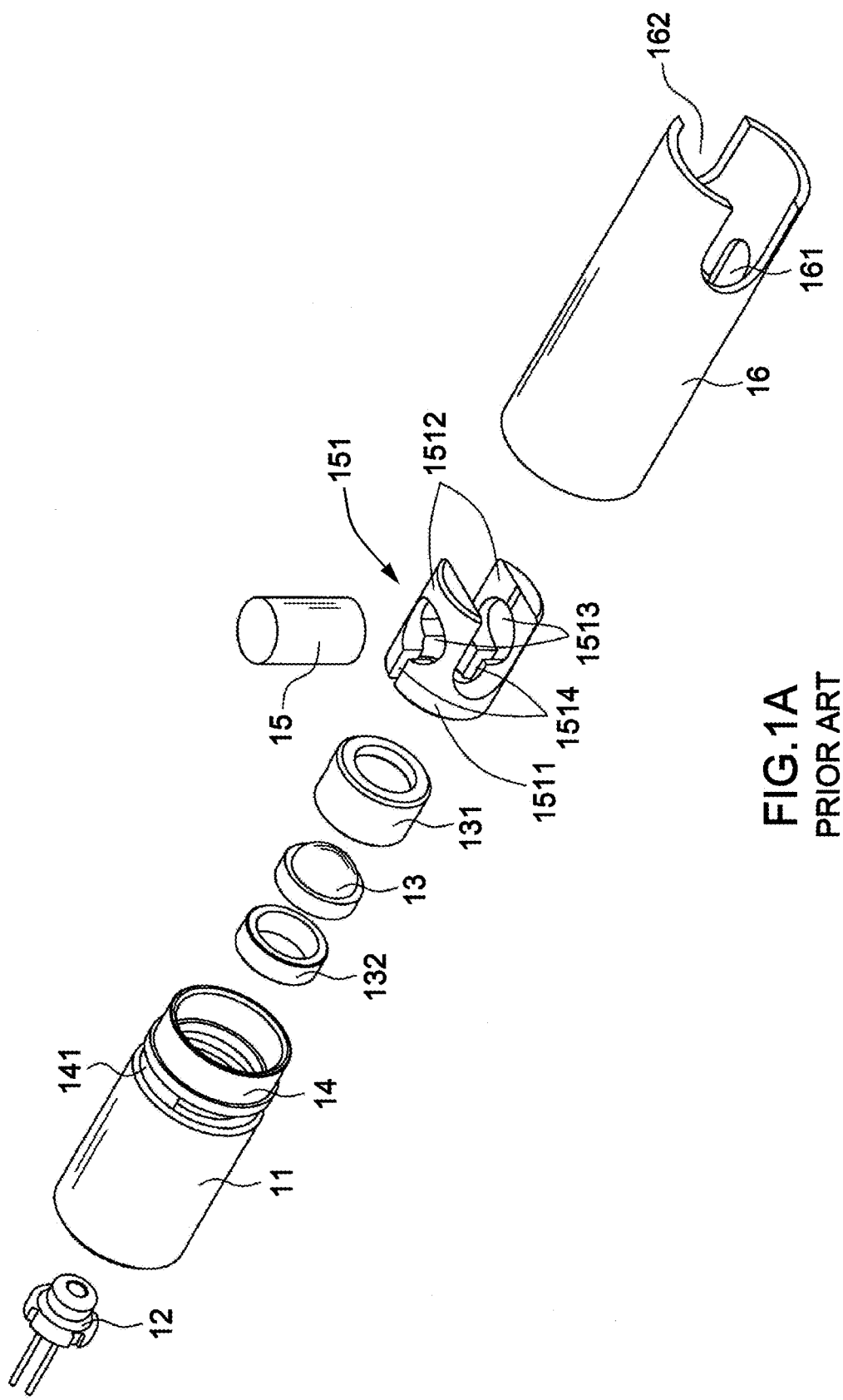
FIG. 1A is an exploded diagram of a conventional laser adjusting assembly.
Figure 1B:
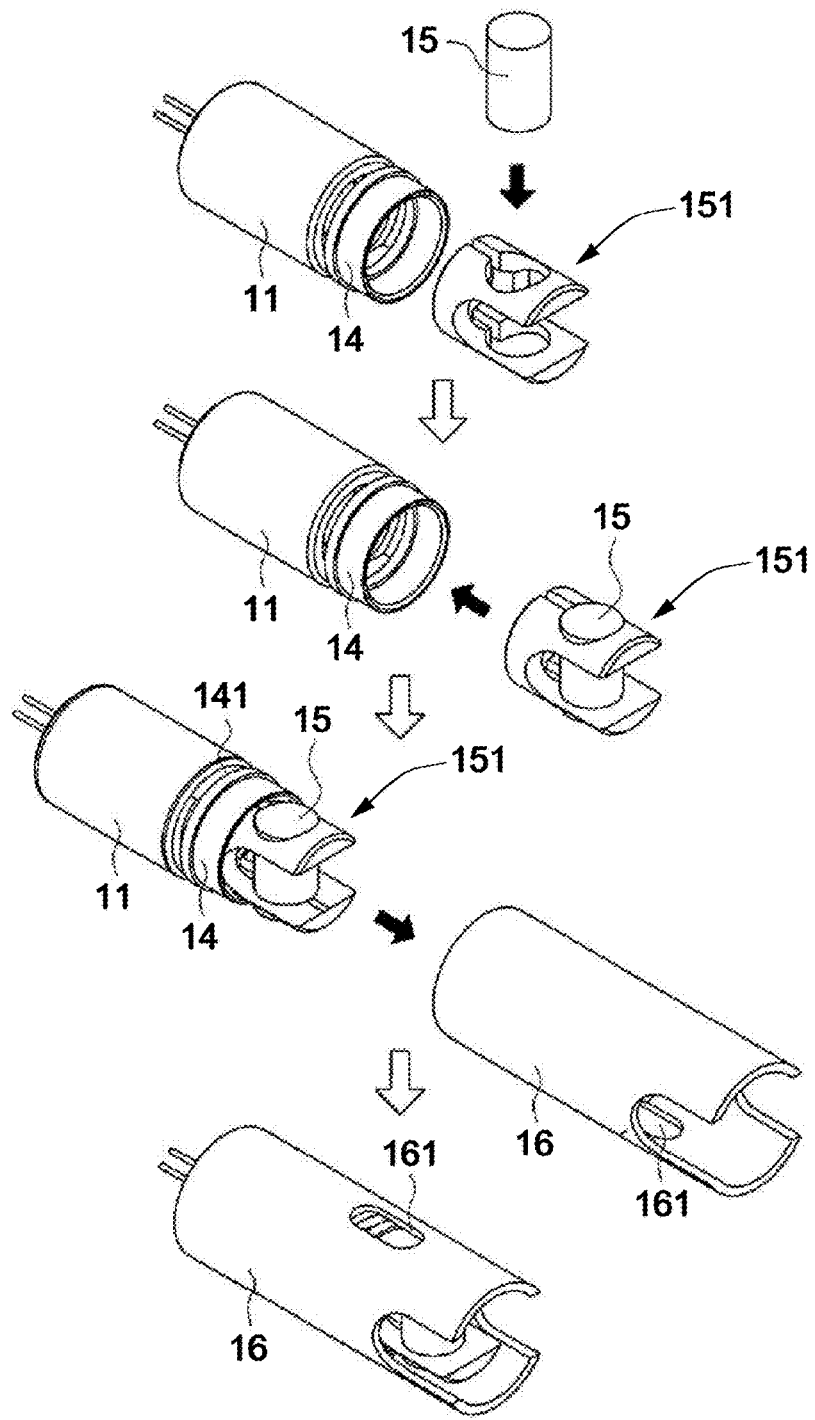
FIG. 1B is a schematic diagram illustrating an assembling process of the conventional laser adjusting assembly of FIG. 1A.
Figure 1C:
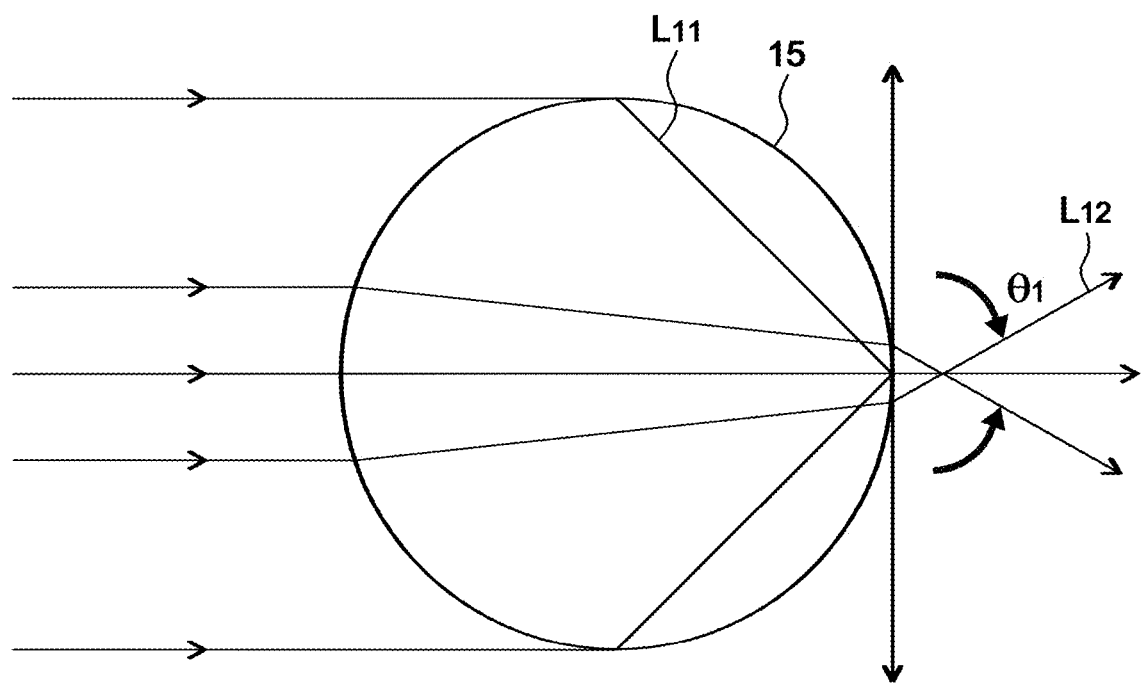
FIG. 1C is a schematic diagram illustrating an optical path of the conventional laser adjusting assembly of FIG. 1A.

Referring to FIGS. 2A-6, in a preferred embodiment, a laser collimating module 20 includes a heat dissipating base 21, a laser diode chip 22, a cap 23 and a cylindrical lens 24.

The heat dissipating base 21 has a fixing element 211 on a top thereof and a plurality of pins 212 at a bottom thereof.

The laser diode chip 22 is disposed on the fixing element 211 of the heat dissipating base 21.

The cap 23 is covering on the heat dissipating base 21 and has a placing space 231 therein and an opening 232 on a top thereof. The opening 232 is arranged above the placing space 231 and connecting thereto, correspondingly aligning with the laser diode chip 22.

The cylindrical lens 24 is disposed in the placing space 231 and has a first surface 241 facing toward the laser diode chip 22 with a first minimized distance $D_1$ arranged therebetween and a second surface 242 facing toward the opening 232 with a second minimized distance $D_2$ arranged therebetween. In this embodiment, the cylindrical lens 24 is either cylindrical or semi-cylindrical, but the present invention is not limited to such application.

Figure 2A:
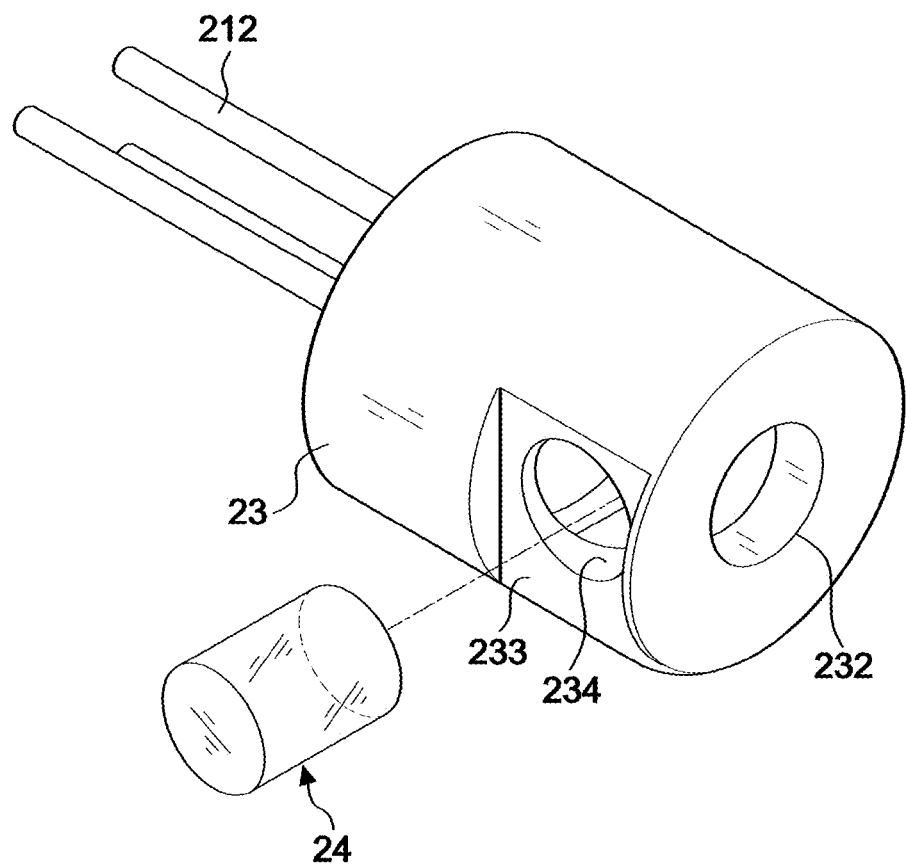
FIG. 2A is a perspective view of the present invention before a cylindrical lens thereof is placed inside the laser collimating module.
Figure 2B:
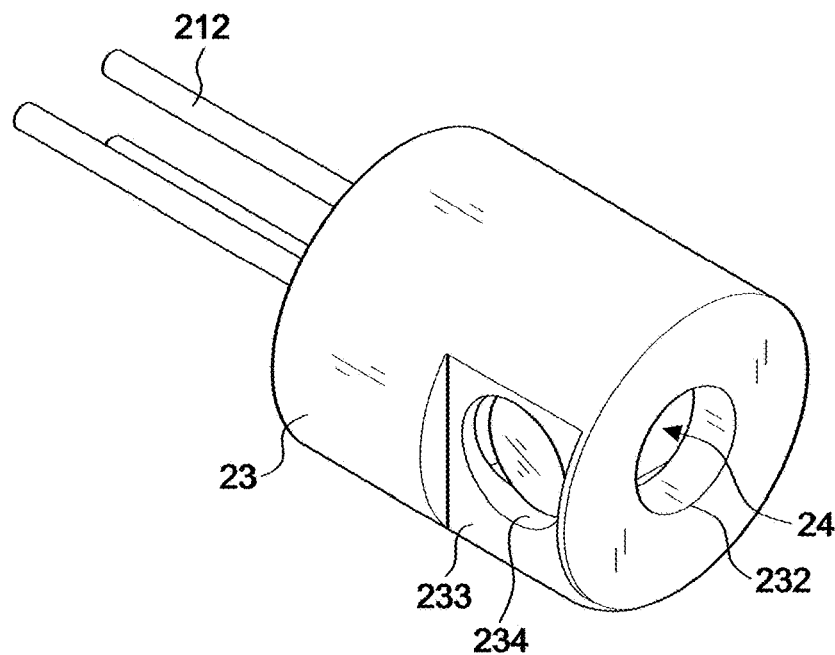
FIG. 2B is a perspective view of the present invention illustrating the cylindrical lens placed inside the laser collimating module before an adhesive is filled therein.
Figure 2C:
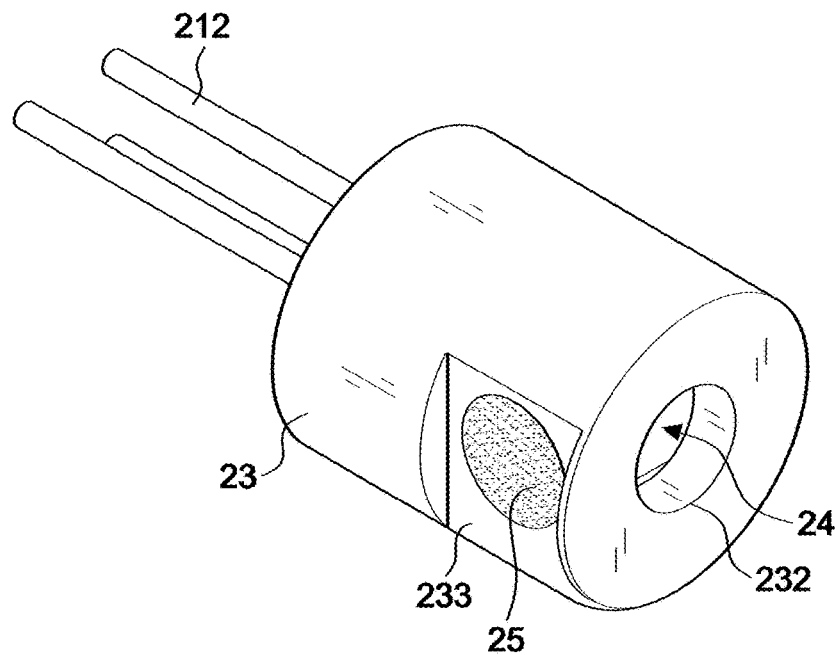
FIG. 2C is a perspective view of the present invention illustrating the cylindrical lens placed inside the laser collimating module after an adhesive is filled therein.
Figure 3A:
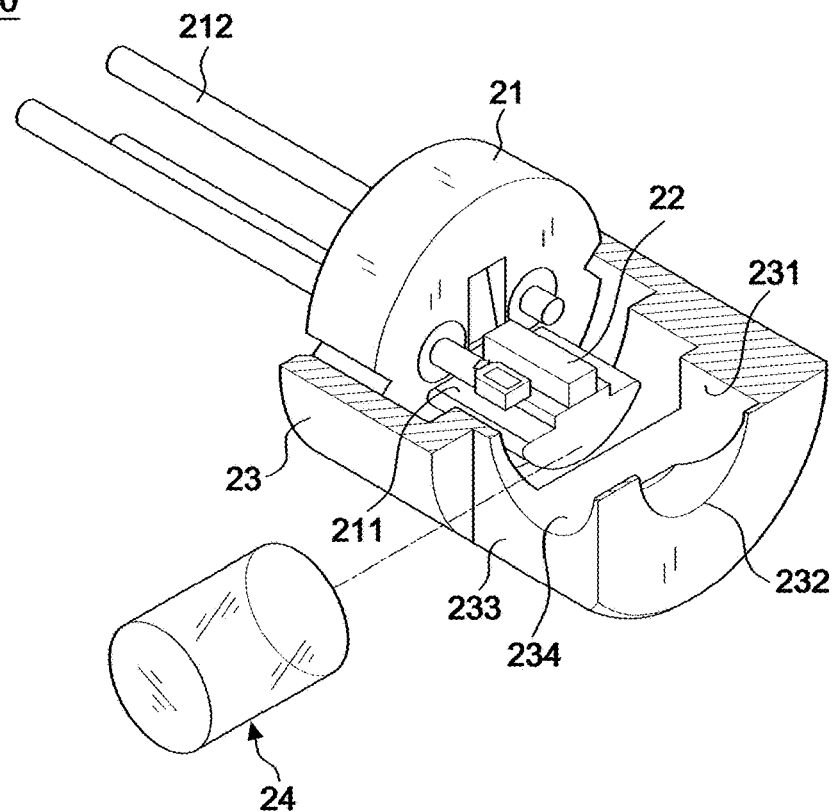
FIG. 3A is a partially sectional view of the present invention illustrating an inner structure thereof before the cylindrical lens is placed therein.
Figure 3B:
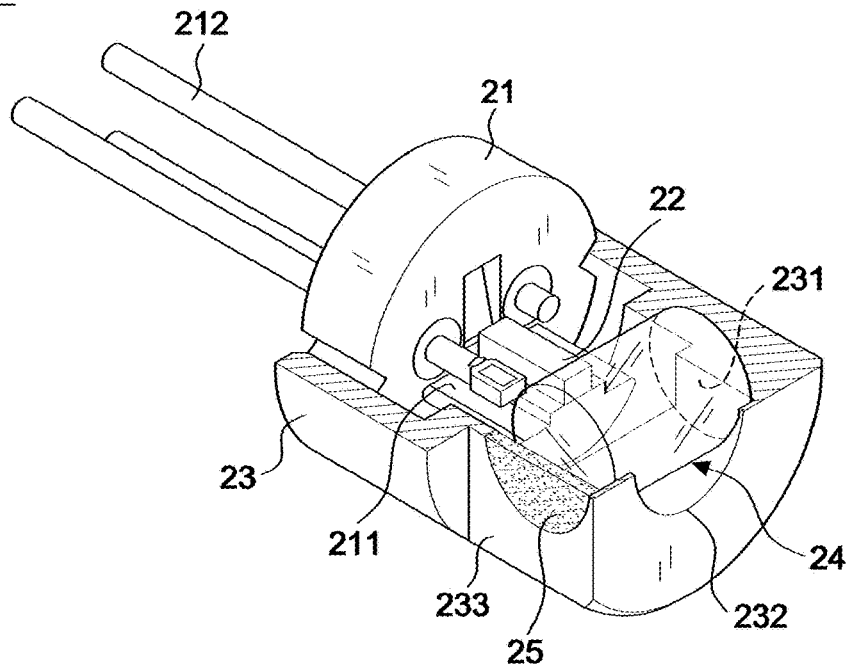
FIG. 3B is a partially sectional view of the present invention illustrating an inner structure thereof after the cylindrical lens is placed therein.
Figure 3C:
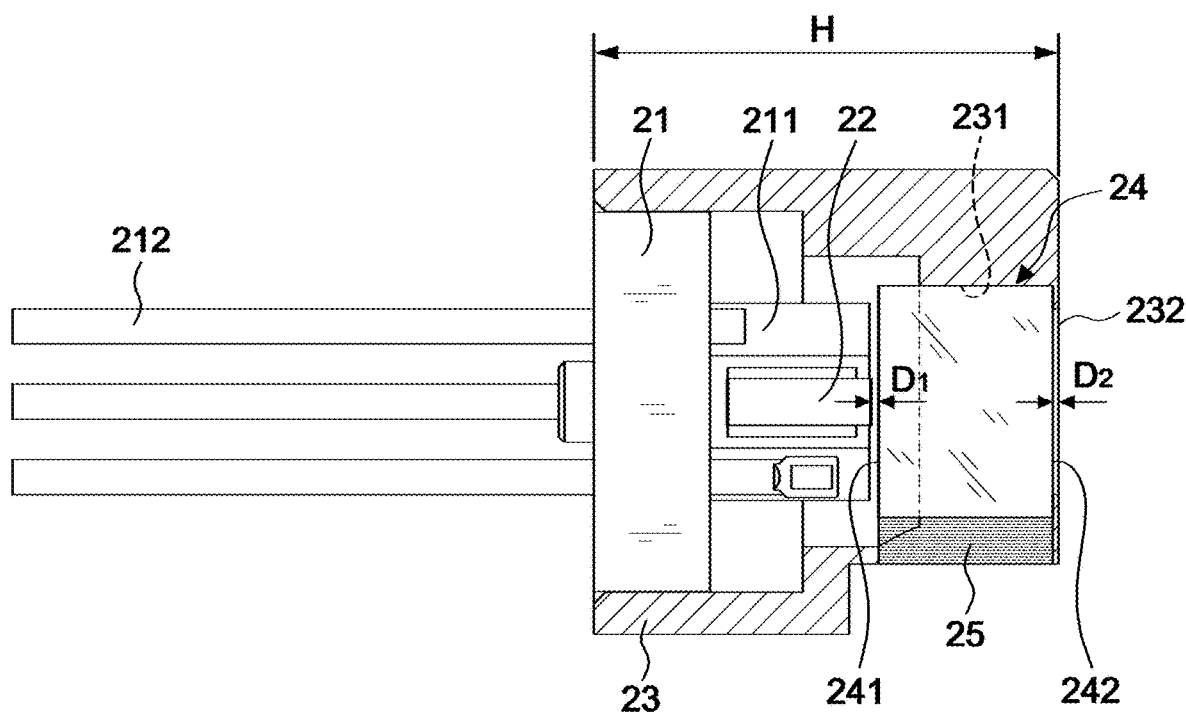
FIG. 3C is a sectional view of FIG. 3B.
Figure 4A:
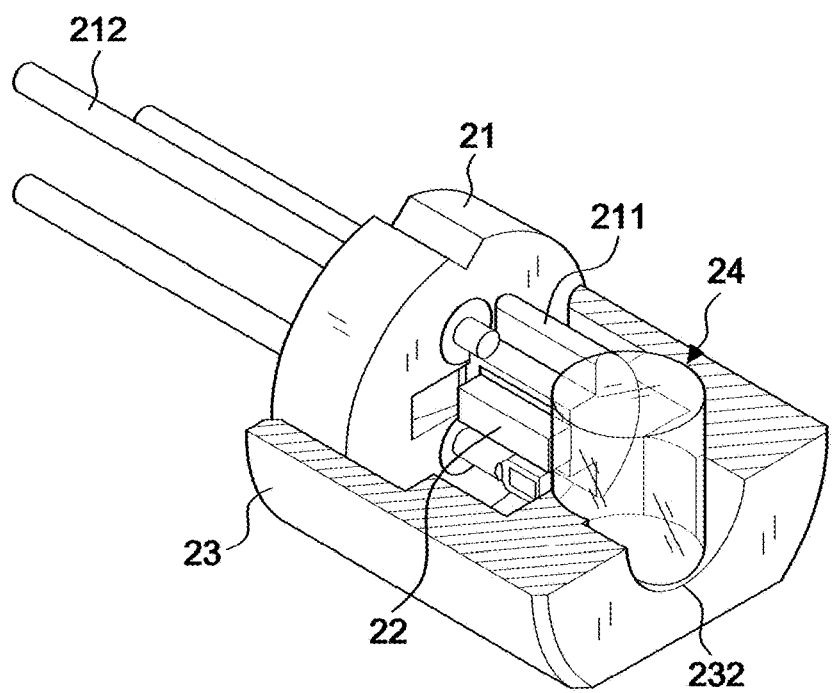
FIG. 4A is another partially sectional view of the present invention illustrating an inner structure thereof after the cylindrical lens is placed therein.
Figure 4B:
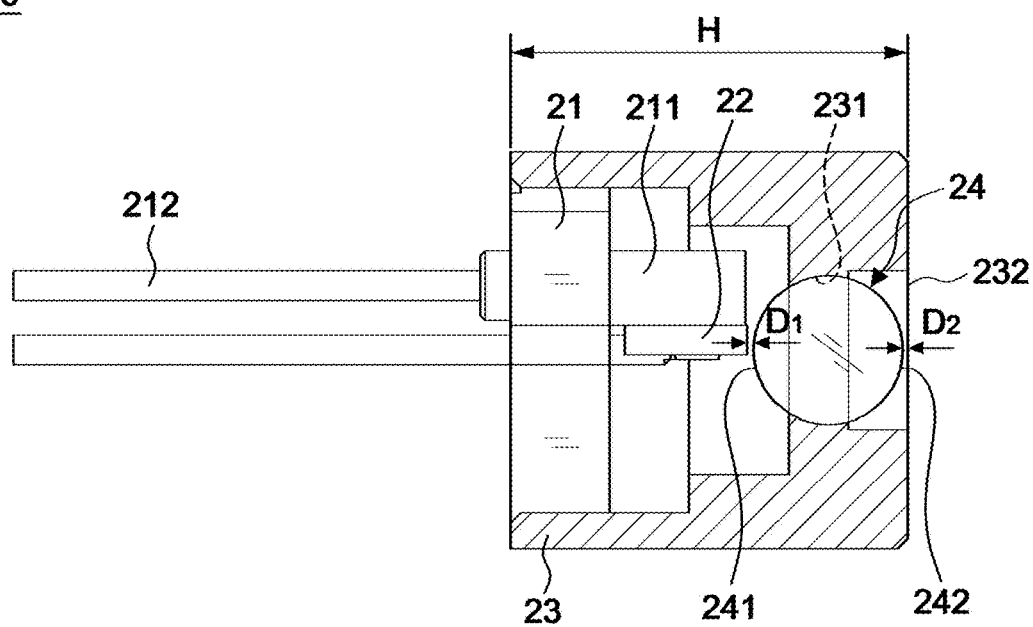
FIG. 4B is a sectional view of FIG. 4A.

Referring to FIGS. 2A-2C, the cap 23 includes a flat surface 233 on a lateral side thereof connecting to the placing space 231, forming a circular opening 234 to be filled in with an adhesive 25 for fixing a position of the cylindrical lens 24. Further referring to FIGS. 3A-4B, the first minimized distance $D_1$ between the first surface 241 of the cylindrical lens 24 and the laser diode chip 22 and the second minimized distance $D_2$ between the second surface of the cylindrical lens 24 and the opening 232 allow the laser collimating module 20 to be assembled with a height of 4 mm But the present invention is not limited to such application.

Figure 5A:
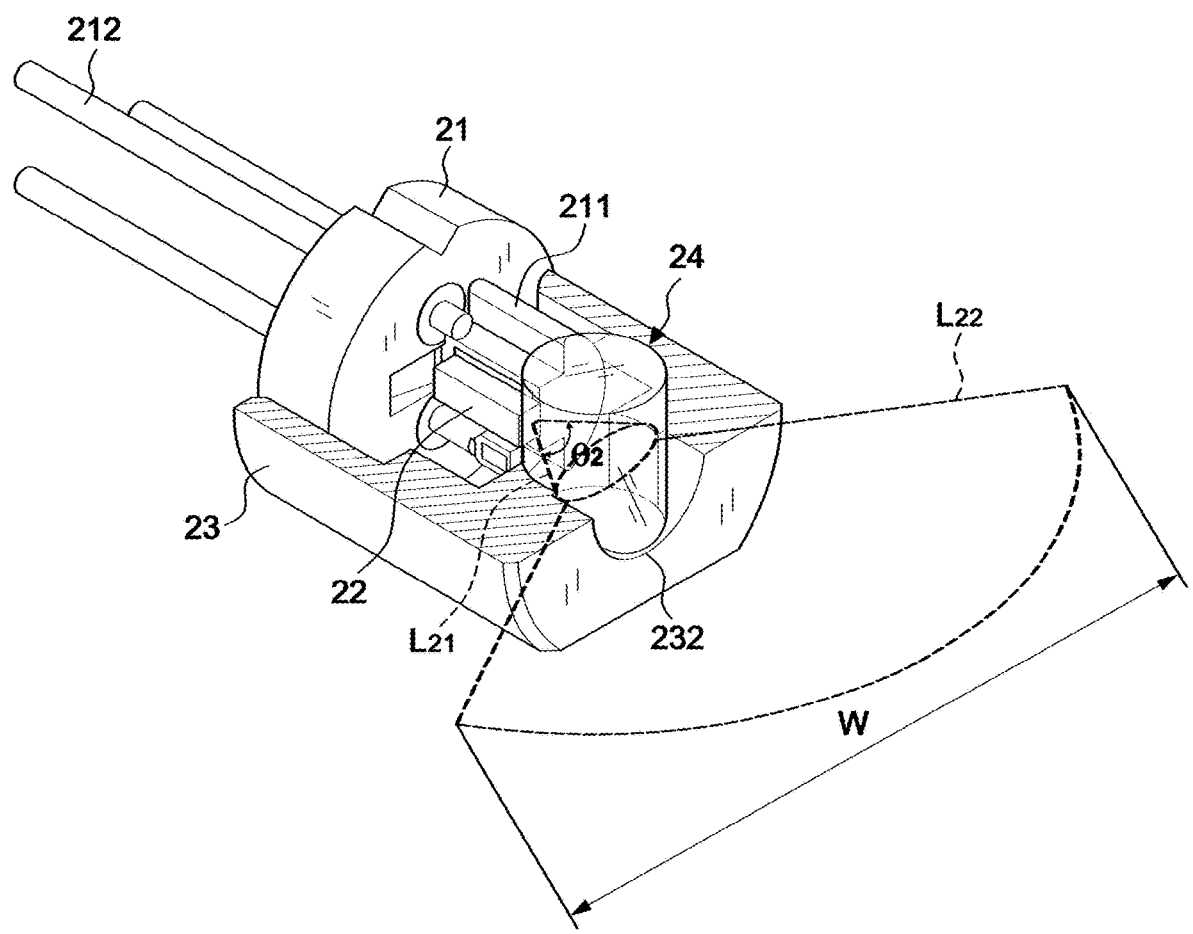
FIG. 5A is a schematic diagram illustrating an optical path of the present invention.
Figure 5B:
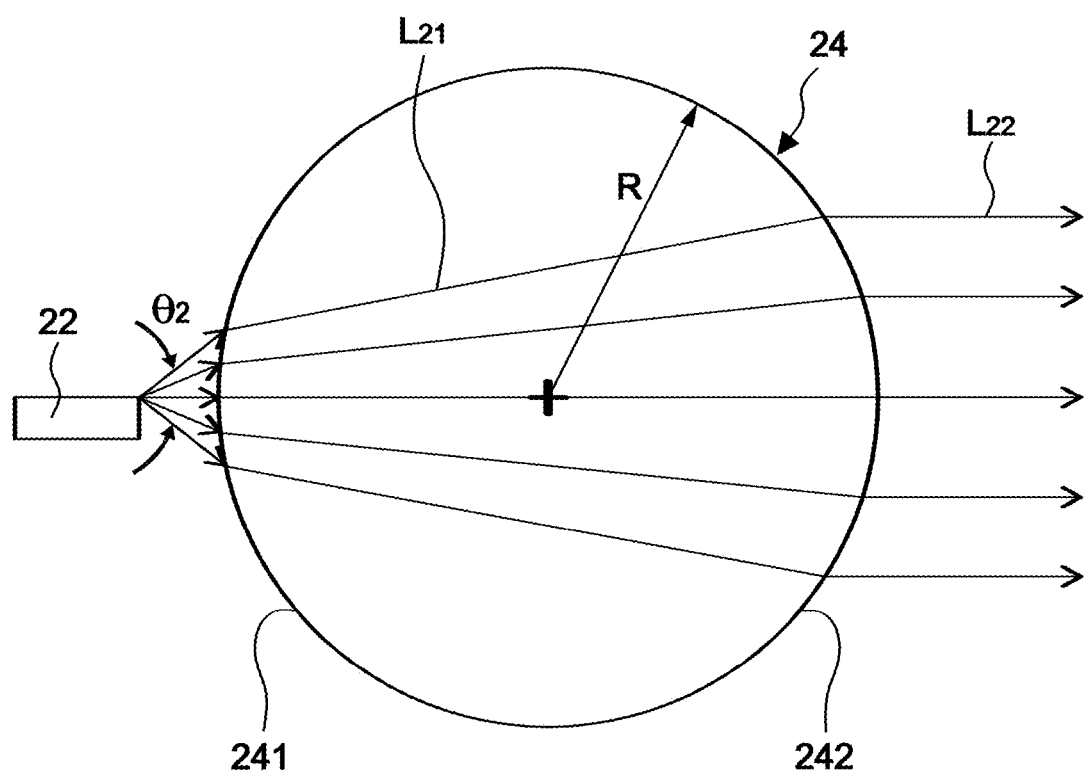
FIG. 5B is another schematic diagram illustrating the optical path of the present invention.

With reference to FIGS. 5A and 5B, the laser diode chip 22 is stimulated and emits an elliptical laser beam $L_{21}$ to the cylindrical lens 24, forming a light emitting angle $\theta_2$ due to the primary optics design of the present invention. As the laser beam $L_{21}$ passes through the cylindrical lens 24, the light emitting angle $\theta_2$ is narrowed and the laser beam $L_{21}$ is collimated to become a linear beam $L_{22}$ emitted from the laser collimating module 20. In this embodiment, the cylindrical lens 24 has a radius R arranged between 0.5-1 mm for the purpose of narrowing a width W of the linear beam $L_{22}$ within 2 mm. But the present invention is not limited to such application.

Figure 6:
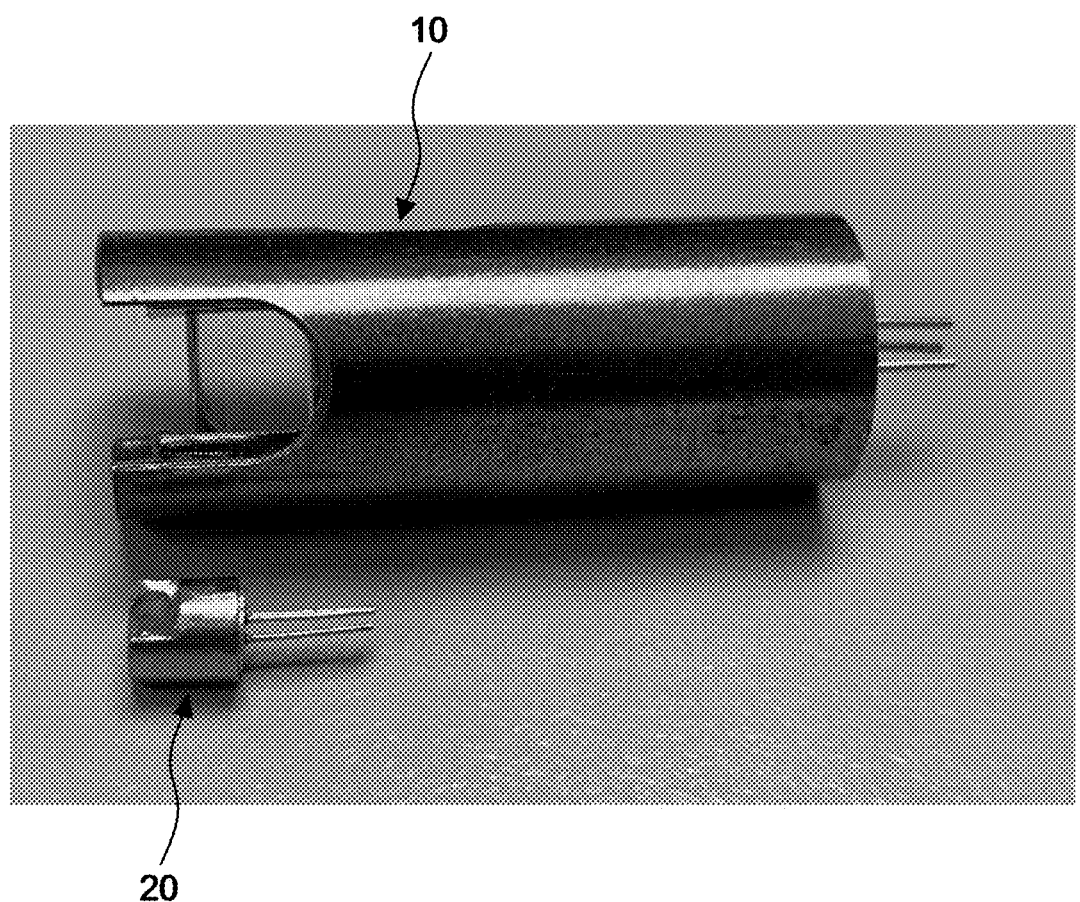
FIG. 6 is a picture for comparison of volumes between the conventional laser adjusting assembly and the laser collimating module of the present invention.

With the structure disclosed above, a comparison chart can be concluded in the following with reference to FIG. 6.

| | Amount of components | Volume | Optics design structure | Whether it is possible to narrow the laser beams emitted therefrom |
|---|---|---|---|---|
| Conventional laser adjusting assembly | More | Greater | Secondary optics design | No |
| Laser collimating module | Less | Less | Primary optics design | Yes |

In short, the laser collimating module 20 of the present invention has a miniature volume of 4 mm-height H and a narrowed linear beam $L_{22}$ of 2 mm width W, thereby solving the problems of conventional laser adjusting assembly including great volumes and impossibility of reducing the height of the assembly and the width of the laser beams emitted therefrom.

What is claimed is:

1. A laser collimating module comprising:
a heat dissipating base including a fixing element on a top thereof and a plurality of pins at a bottom thereof;
a laser diode chip disposed on said fixing element;
a cap covering on said heat dissipating base and including a placing space therein and an opening on a top thereof, said opening arranged above said placing space and connecting thereto, correspondingly aligning with said laser diode chip; and
a cylindrical lens disposed in said placing space, having a first surface facing toward said laser diode chip with a first minimized distance arranged therebetween and a second surface facing toward said opening with a second minimized distance arranged therebetween, thereby said laser diode chip being stimulated, emitting an elliptical laser beam to said cylindrical lens and forming a light emitting angle; as said laser beam passing through said cylindrical lens, said light emitting angle being narrowed and said laser beam being collimated and becoming a linear beam emitted from said laser collimating module,
wherein the cap includes a flat surface on a lateral side thereof connecting to the placing space, forming a circular opening to be filled in with an adhesive for fixing a position of the cylindrical lens.

2. The laser collimating module as claimed in claim 1, wherein the cylindrical lens has a radius arranged between 0.5-1 mm.

3. The laser collimating module as claimed in claim 1, wherein the cylindrical lens is arranged in a shape of either cylindrical or semi-cylindrical.

* * * * *